US011169184B2

(12) United States Patent
Cugat et al.

(10) Patent No.: US 11,169,184 B2
(45) Date of Patent: Nov. 9, 2021

(54) METHOD FOR MEASURING THE INTENSITY OF A CURRENT IN A CONDUCTOR

(71) Applicants: INSTITUT POLYTECHNIQUE DE GRENOBLE, Grenoble (FR); CENTRE NATIONAL DE LA RECHERCHE SCIENTIFIQUE, Paris (FR)

(72) Inventors: Orphée Cugat, Grenoble (FR); Jérôme Delamare, Grenoble (FR); Olivier Pinaud, Grenoble (FR); Laure-Line Rouve, Theys (FR); Benjamin Wilsch, Grenoble (FR)

(73) Assignees: INSTITUT POLYTECHNIQUE DE GRENOBLE, Grenoble (FR); CENTRE NATIONAL DE LA RECHERCHE SCIENTIFIQUE, Paris (FR)

(*) Notice: Subject to any disclaimer, the term of this patent is extended or adjusted under 35 U.S.C. 154(b) by 152 days.

(21) Appl. No.: 16/604,927

(22) PCT Filed: Apr. 12, 2018

(86) PCT No.: PCT/EP2018/059449
§ 371 (c)(1),
(2) Date: May 21, 2020

(87) PCT Pub. No.: WO2018/189327
PCT Pub. Date: Oct. 18, 2018

(65) Prior Publication Data
US 2020/0284824 A1 Sep. 10, 2020

(30) Foreign Application Priority Data
Apr. 13, 2017 (FR) ...................... 1753267

(51) Int. Cl.
*G01R 15/20* (2006.01)
*G01R 19/25* (2006.01)
(Continued)

(52) U.S. Cl.
CPC ....... *G01R 15/202* (2013.01); *G01R 19/2513* (2013.01); *G01R 33/0017* (2013.01); *G01R 33/07* (2013.01)

(58) Field of Classification Search
CPC . G01R 19/2513; G01R 33/0017; G01R 33/07
See application file for complete search history.

(56) References Cited

U.S. PATENT DOCUMENTS

| 6,604,225 B1* | 8/2003 | Otsu | G06F 17/16 |
|---|---|---|---|
| | | | 716/136 |
| 2016/0223699 A1* | 8/2016 | Peczalski | G01V 3/02 |
| 2016/0356822 A1* | 12/2016 | Peczalski | G01R 33/096 |

FOREIGN PATENT DOCUMENTS

| DE | 19813890 A1 | 9/1999 |
|---|---|---|
| DE | 10003584 A1 | 8/2001 |

(Continued)

OTHER PUBLICATIONS

International Search Report from corresponding International Application No. PCT/EP2018/059449, dated Jun. 11, 2018, pp. 1-5, European Patent Office, Rijswijk, The Netherlands.

(Continued)

*Primary Examiner* — Alvaro E Fortich
(74) *Attorney, Agent, or Firm* — Hauptman Ham, LLP

(57) ABSTRACT

A method for measuring the intensity of a current, comprising the steps of obtaining a computation matrix M comprising a set of terms, proportional to a distance between a measuring point and a reference point, raised to a power higher than or equal to zero, forming a vector B including measurements of the value of the magnetic field in a (Continued)

Figure 1:
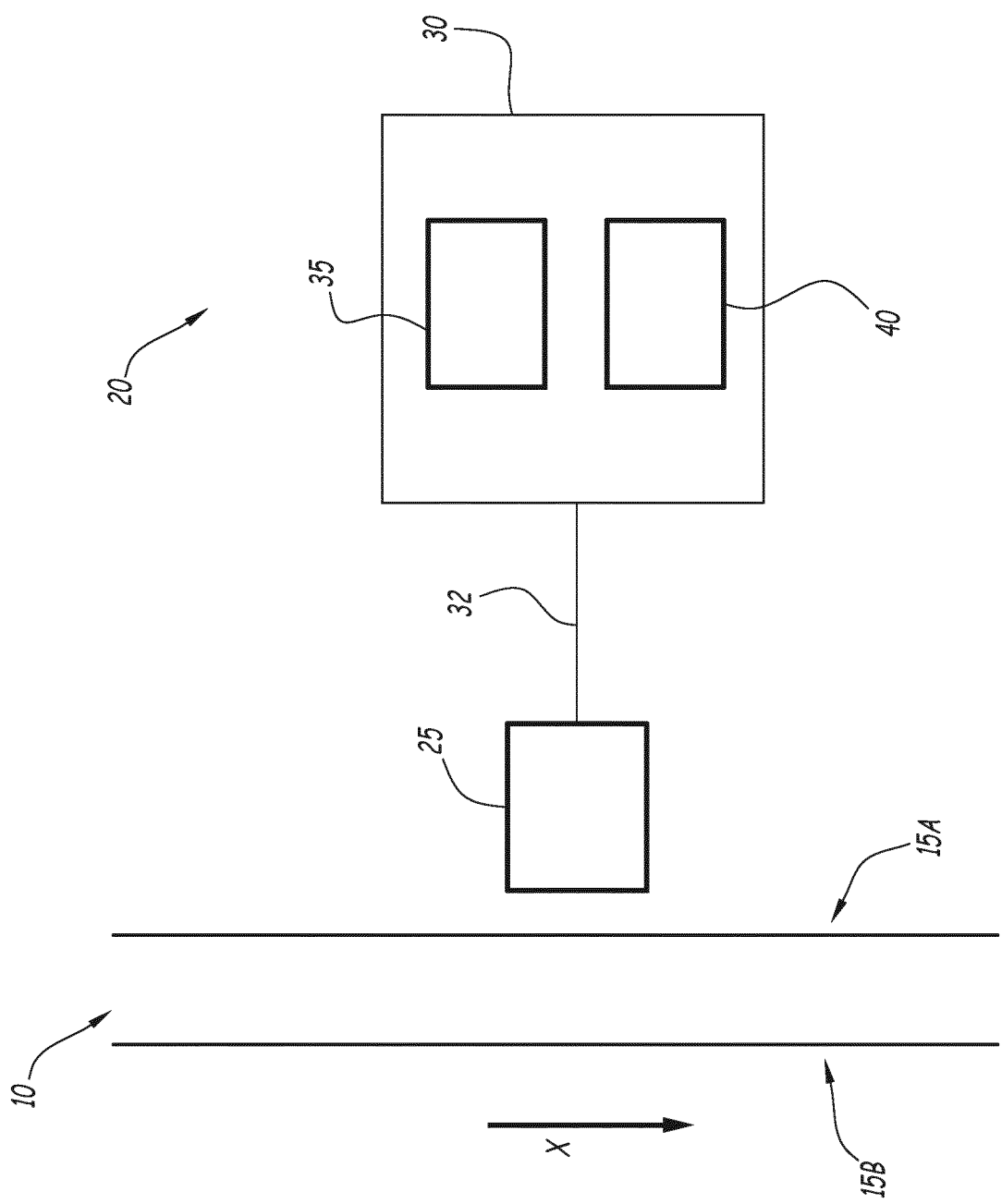

direction at a measuring point, computing the components of a vector A, each component being a coefficient of a decomposition of the magnetic field into spatial harmonics proportional to the intensity of the current such that the matrix relation B=M×A is satisfied, and determining the intensity.

11 Claims, 5 Drawing Sheets

(51) Int. Cl.
  *G01R 33/00* (2006.01)
  *G01R 33/07* (2006.01)

(56) References Cited

FOREIGN PATENT DOCUMENTS

| | | |
|---|---|---|
| WO | 2013068360 A1 | 5/2013 |
| WO | 2015030871 A1 | 3/2015 |

OTHER PUBLICATIONS

Written Opinion from corresponding International Application No. PCT/EP2018/059449, pp. 1-10, European Patent Office, Rijswijk, The Netherlands.

\* cited by examiner

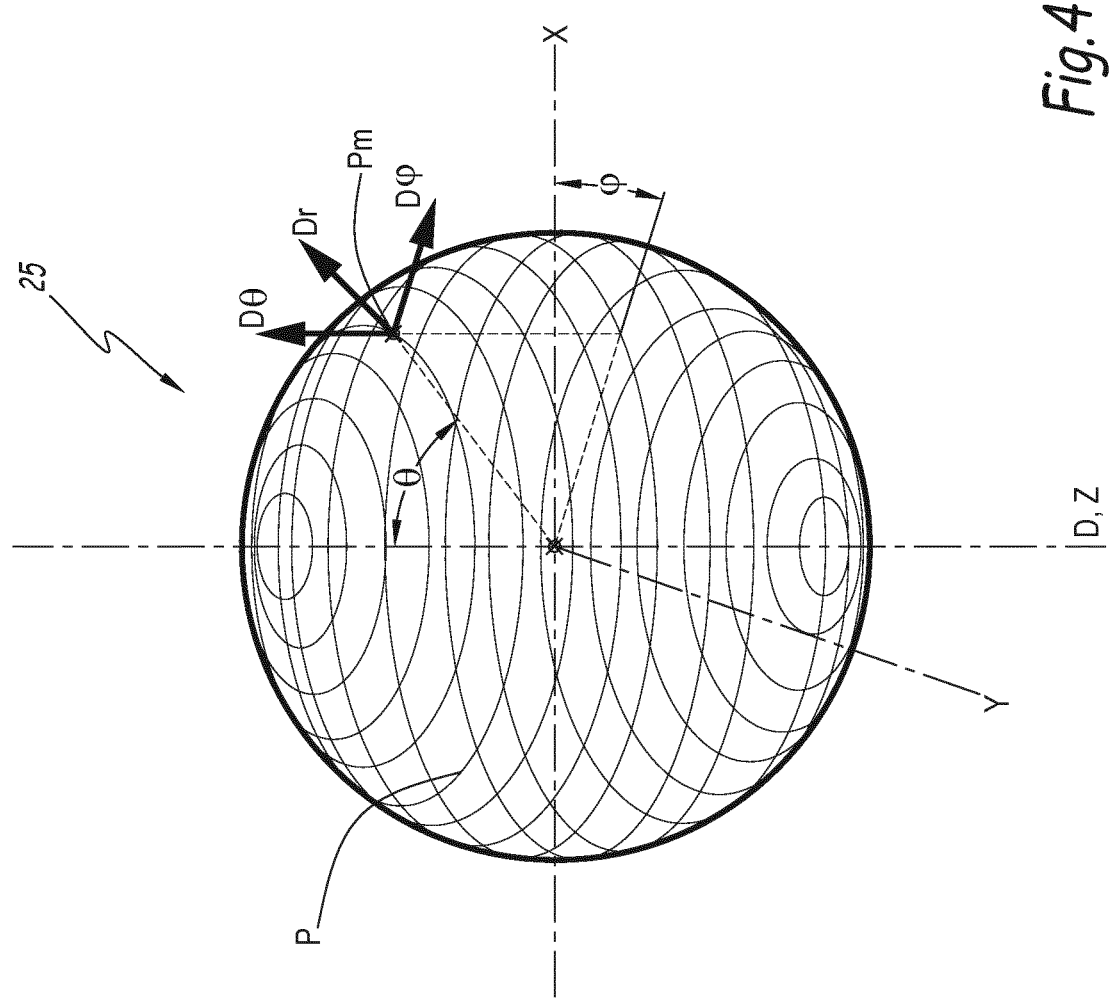

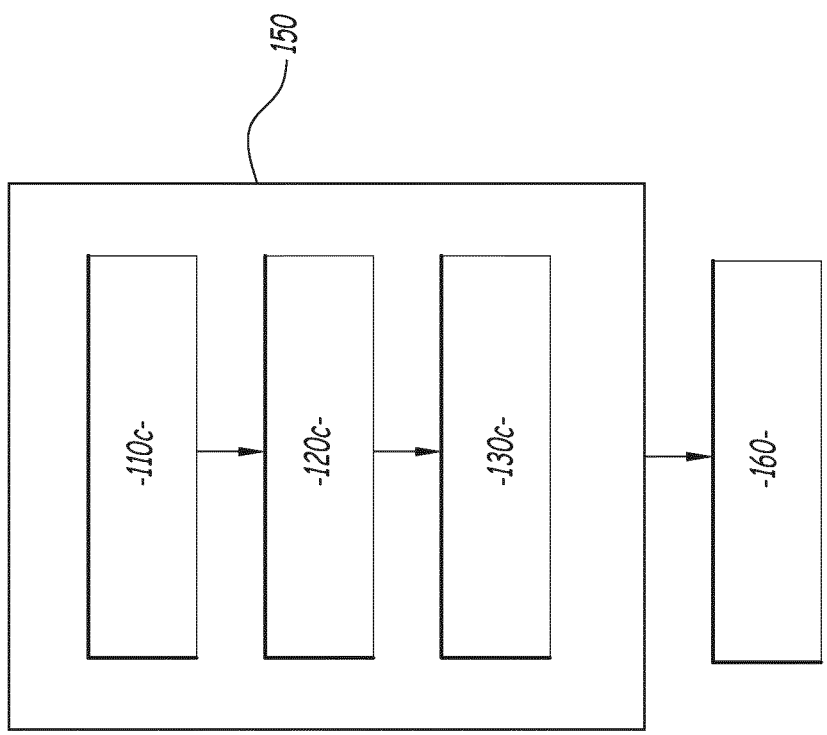

METHOD FOR MEASURING THE INTENSITY OF A CURRENT IN A CONDUCTOR

RELATED APPLICATIONS

The present application is a National Phase of International Application Number PCT/EP2018/059449, filed Apr. 12, 2018, and claims the priority of French Application No. 1753267, filed Apr. 13, 2017, and both are hereby incorporated by reference in their entirety into the present application.

The present invention relates to a method for measuring the intensity of a current in an electrical conductor. The present invention further relates to a method for designing a measuring sensor. The present invention further relates to a computer, a current sensor and a measuring system associated therewith.

Current-measuring sensors are used in numerous applications to assess the intensity of currents passing through conductors. For example, such sensors allow electricity distribution networks to be managed and are thus installed at different points on the networks to assess the effective consumption of the different facilities powered and/or to monitor the overall network condition. The information collected is then used to optimise management of the distribution network.

Numerous sensors used in such applications assess the current passing through a conductor by measuring magnetic fields created by the circulation of the current in the conductor. For example, Rogowski coils or magnetometer assemblies are disposed around the conductor in order to estimate the value of the intensity of the current.

However, electricity distribution networks are often polyphase networks, in particular three-phase networks, wherein currents simultaneously circulate in conductors located close to one another. Under such conditions, the magnetic fields in the vicinity of a conductor are significantly modified by currents circulating in the nearby conductors. The measurement, carried out by these sensors, of the intensity of the current can thus be less precise. These sensors must thus be shielded to prevent or at least attenuate the influence of external interference, which makes the manufacture of these sensors more complex and increases the dimensions thereof.

Moreover, the aforementioned sensors must be placed around the conductor to be measured in order to procure a sufficient level of precision. The installation of these sensors is thus burdensome, and sometimes requires the conductors to be detached at one end so that the sensor can be wound around the conductor. Even when this is not the case, installation is generally complex and long, frequently requiring the conductor to be disconnected from the power supply. Installation of the sensors is thus burdensome for the network operator, since it requires part of the network to be temporarily made unavailable.

There is therefore a need for a method for measuring the intensity of a current circulating in an electrical conductor, which method is precise, requires small dimensions and is easier to implement than the measuring methods of the prior art.

For this purpose, the invention proposes a method for measuring the intensity of a current in an electrical conductor, the method comprising the steps of:

obtaining a computation matrix M comprising a set of terms, each term of the same row of the computation matrix being proportional to the same distance between a measuring point and a reference point, raised to a power higher than or equal to zero, forming a measurement vector B including components, each component being a measurement of the value of the magnetic field in one direction at a measuring point, each measuring point associated with a direction being different from the other measuring points associated with the same direction, computing the components of a vector of coefficients A, each component being a coefficient, each coefficient being a coefficient of a decomposition of the magnetic field into spatial harmonics and being proportional to the intensity of the current such that the matrix relation B=M×A is satisfied, where x denotes the matrix multiplication operation, and determining the intensity of the current from at least the components computed.

According to specific embodiments, the measuring method comprises at least one of the following features, which must be considered singly or according to any combinations technically possible:

the step of obtaining a computation matrix and the computation step are dependent on the parameters of the current sensor, the method further comprising:
  an optimisation step comprising obtaining at least one optimised parameter, such as the actual position of the reference point relative to the electrical conductor,
  a step of computing at least one conversion coefficient from the at least one optimised parameters,
the determination step comprising dividing a real value of a coefficient by the conversion coefficient.

the obtainment step is implemented by searching for a set of optimised parameters minimising the deviation between at least two ratios between two components of the vector of coefficients obtained during the step of computing the components, and two ratios between two intermediate components, each intermediate component being a component of a vector of coefficients computed for a set of possible parameters of the current sensor.

a first distance is defined between the reference point and the point of the conductor located the closest to the reference point, the maximum distance of the distances of the measuring points being strictly less than the first distance.

a first distance is defined between the reference point and the point of the conductor located the closest to the reference point, the maximum distance of the distances of the measuring points being less than or equal to 85% of the first distance.

the measuring points are arranged along a circle having the reference point at its centre or along a sphere having the reference point at its centre.

a first distance is defined between the reference point and the point of the conductor located the closest to the reference point, the first distance being less than or equal to 10 centimetres and each power being less than or equal to 5.

The invention further proposes a method for designing a measuring sensor including a plurality of magnetic field sensors, the design method determining, for a desired measurement precision, the number of magnetic field sensors, as well as the spatial positioning of the magnetic field sensors, using the measuring method defined hereinabove.

The invention further proposes a computer adapted to implement the following steps of:

obtaining a computation matrix M comprising a set of terms, each term of the same row of the computation matrix being proportional to the same distance of a measuring point, raised to a power higher than or equal to zero, receiving measurements of the value of the magnetic field in one direction at a measuring point, each measuring point associated with a direction being different from the other measuring points associated with the same direction and at a distance from a reference point, referred to as the distance of the measuring point, forming a measurement vector B including components, each component being a measurement received, computing the components of a vector of coefficients A, each component being a coefficient, each coefficient being a coefficient of a decomposition of the magnetic field into spatial harmonics and being proportional to the intensity of the current such that the matrix relation B=M×A is satisfied, where x denotes the matrix multiplication operation, and determining the intensity of the current from at least the components computed.

The invention further proposes a current sensor configured to measure an intensity of a current passing through an electrical conductor, the current sensor comprising a plurality of magnetic field sensors and a computer as defined hereinabove, each magnetic field sensor being configured to measure the value of the magnetic field in a direction at a measuring point, each measuring point being different and at a distance from a reference point, and to transmit the measured value to the computer.

The invention further proposes a system for measuring the currents passing through a plurality of electrical conductors, the measuring system comprising a plurality of current sensors as defined hereinabove and a single central controller, each current sensor being configured to communicate with the central controller.

Figure 2:
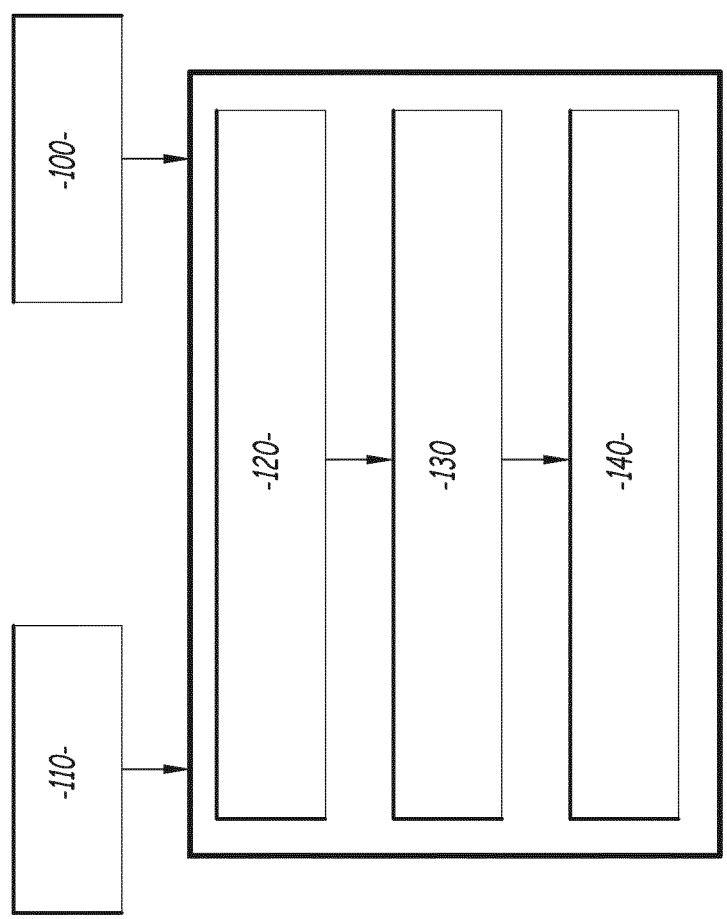
Figure 3:
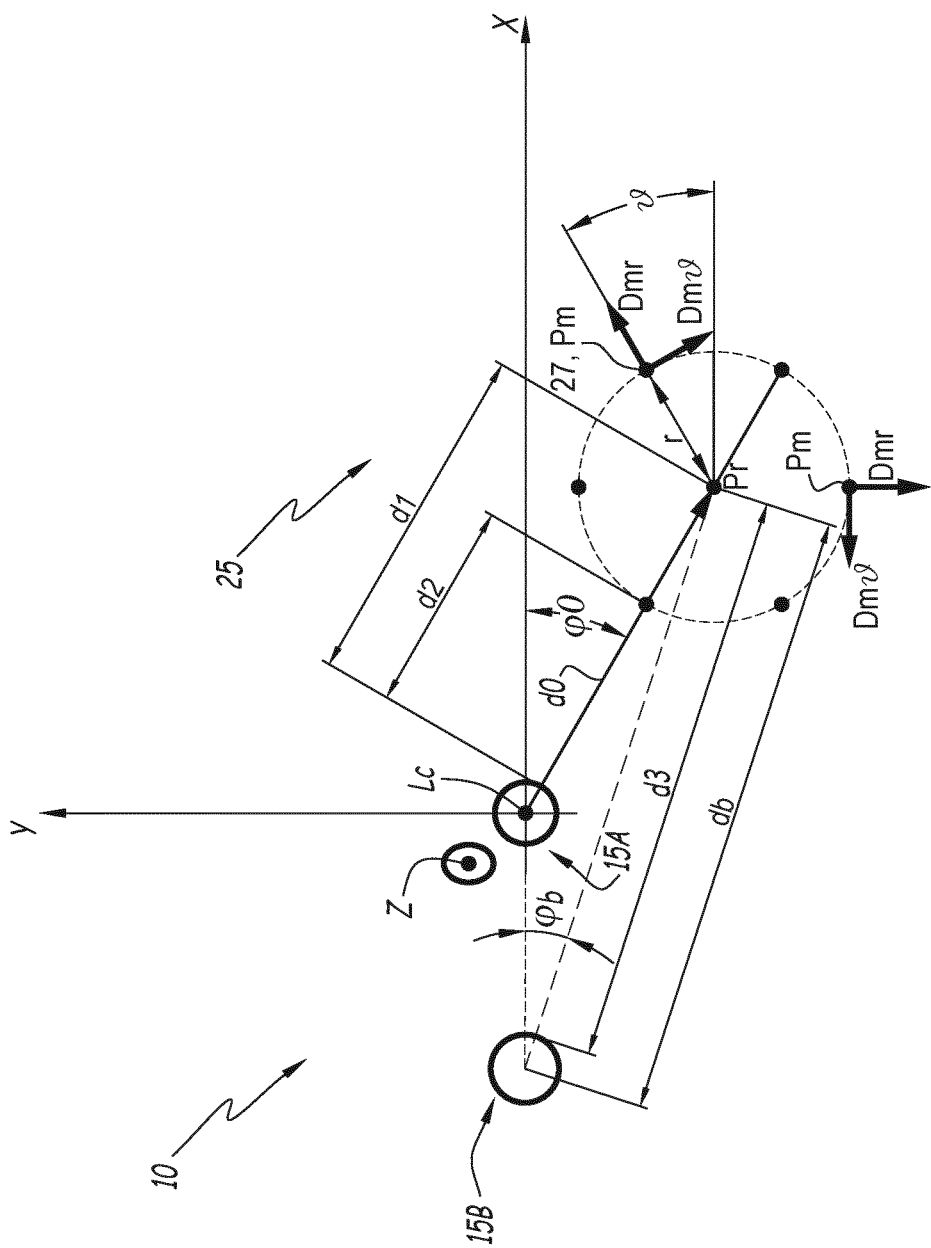

Features and advantages of the invention will appear after reading the following description, which is provided for purposes of illustration only and not intended to limit the scope of the invention, given with reference to the accompanying drawings, wherein:

FIG. 1 shows a partial diagrammatic view of an electricity distribution network equipped with a first example of a current sensor comprising an array of magnetic field sensors, FIG. 2 is a flowchart of the steps of a current-measuring method implemented by the current sensor in FIG. 1, comprising a calibration step, FIG. 3 is a diagrammatic view of one example of the magnetic field sensor array in FIG. 1, and FIG. 4 is a diagrammatic view of a magnetic field sensor array of a second example of a current sensor, and FIG. 5 is a flowchart showing the steps of one example of the calibration step in FIG. 2.

An electricity distribution network 10 has been shown in part in FIG. 1.

The network 10 comprises a plurality of conductors 15A, 15B. According to the example in FIG. 1, the plurality of conductors comprises a first conductor 15A and at least one second conductor 15B.

The network 10 is further equipped with at least one first example of a current sensor 20.

Each conductor 15A, 15B is configured such that it receives an electric current from a distribution board and transmits the electric current to a corresponding electrical installation.

Each electric current is, for example, a direct current.

Alternatively, at least one electric current is an alternating current.

An intensity IA, IB and an electrical voltage Ua, Ub are defined for each electric current passing through a conductor 15A, 15B.

Each electrical voltage Ua, Ub can lie in the range 50 volts (V) to 75 kilovolts (kV). For example, each electrical voltage is equal to 20 kV.

Each current sensor 20 is configured to determine the intensity IA, IB of at least one electric current. According to the example in FIG. 1, the current sensor 20 is configured to measure the intensity IA of the current passing through the first conductor 15A.

Each current sensor 20 includes an array 25 of magnetic field sensors 27 and a computer 30.

For clarity purposes, a single array 25 is shown in FIG. 1 and is described in the description hereinbelow. However, it should be noted that the same current sensor 20 is capable of including a plurality of arrays 25. For example, according to one alternative embodiment, the current sensor 20 includes two arrays 25, one for each conductor 15A, 15B.

The array 25 is configured to determine a number Nv of values of components of the magnetic field Cm. In particular, the array 25 is configured to simultaneously determine the number Nv of values. The term "simultaneously" is understood herein to mean that the values are determined during the same time interval. Each time interval is relatively short compared to the fluctuation time of the currents to be measured.

For example, the number of values Nv is greater than or equal to 10.

Each magnetic field sensor 27 is configured to measure a value Gm at a measuring point Pm of at least one component of the magnetic field Cm in a measurement direction Dm.

In the description hereinbelow, each measuring point Pm will be denoted by an index i ranging from 1 to a first number N1.

According to an alternative embodiment, each magnetic field sensor 27 is configured to measure values Gm of a plurality of components of the magnetic field at a single measuring point $Pm_i$. For example, each magnetic field sensor 27 is configured to measure values Gm of two components of the magnetic field at a single measuring point $Pm_i$. Alternatively, each magnetic field sensor 27 is configured to measure values Gm of three components of the magnetic field at a single measuring point $Pm_i$.

Each measuring point $Pm_i$ associated with a measurement direction Dm is different from the other measuring points $Pm_i$ associated with the same measurement direction Dm. For example, the array 25 is configured to simultaneously acquire a single value Gm of a component of the magnetic field Cm in a measurement direction Dm at each measuring point $Pm_i$.

Each measurement direction Dm is, for example, defined in an absolute manner. Directions of a Cartesian coordinate system are examples of directions defined in an absolute manner.

Alternatively, each measurement direction Dm is defined relative to the measuring point considered. For example, radial and orthoradial directions of a coordinate system provided with cylindrical coordinates are examples of directions defined in a relative manner.

According to another embodiment, the array 25 is configured to simultaneously acquire a plurality of values Gm of components of the magnetic field Cm in measurement directions Dm at each measuring point $Pm_i$, only values of components in different measurement directions Dm being simultaneously acquired at the same measuring point $Pm_i$.

Each magnetic field sensor 27 is configured to transmit the measured values Gm to the computer 30. For example, each magnetic field sensor 27 is connected to the computer 30 by a wired connection 32. Alternatively, each magnetic field sensor 27 is configured to transmit the measured values Gm to the computer 30 by radio frequency communication.

The computer 30 is configured to implement a method for measuring the intensity IA of the current in the first conductor 15A.

The computer 30 includes a memory 35 and a processor 40.

The paragraphs below will now describe the functioning of the current sensor 20. A flowchart showing the steps of a method for measuring the intensity IA of the current passing through the first conductor 15A is shown in FIG. 2.

The measuring method comprises a calibration step 100, a step 110 of obtaining a matrix, a formation step 120, a computation step 130 and a determination step 140.

During the measuring method, the array 25 is in an operate position.

When the array 25 in is the operate position, the array 25 is disposed in the vicinity of the first conductor 15A.

For example, the array 25 is fixed to the first conductor 15A by a dedicated fixing arm.

When the array 25 in is the operate position, the array 25 is remote from each conductor 15A, 15B. In particular, the array 25 is remote from the first conductor 15A. The term "remote" is understood herein to mean that no point of the first conductor 15A lies in a planar surface delimited by three segments connecting any combination of three measuring points $Pm_i$, nor in a segment connecting any combination of two measuring points $Pm_i$. In particular, the volumes defined by the set of measuring points $Pm_i$ and the conductor are separate.

A first distance d1 is defined between the reference point Pr and the point of the first conductor 15A located the closest to the reference point Pr. The maximum distance of the distances $r_i$ of the measuring points $Pm_i$, about Pr, is strictly less than the first distance d1. In other words, the current sensor 20 is physically separate from the first conductor 15A. For example, the maximum distance of the distances $r_i$ of the measuring points $Pm_i$ is less than or equal to 85 percent (%) of the first distance d1.

A second distance d2 is defined between the magnetic field sensor 27 located the closest to the first conductor 15A and the point of the first conductor 15A located the closest to the magnetic field sensor 27 considered.

A third distance d3 is defined between the reference point Pr and the point of the second conductor 15B located the closest to the reference point Pr. The third distance d3 is greater than or equal to the first distance d1.

During the calibration step 100, a set of conversion coefficients K is computed.

Each conversion coefficient K is a real number. The step 100 is, for example, implemented once when the current sensor 20 is installed in the operate position thereof. Alternatively, the step 100 is implemented when indices indicate that the current sensor 20 has been displaced relative to the conductors 15A, 15B.

During the step 110 of obtaining a matrix, a computation matrix M is obtained by the computer 30. For example, the computation matrix M is stored in the memory 35.

The computation matrix M is computed as a function of the relative position of the different measuring points Pm relative to the reference point Pr. For example, the obtainment step 110 is implemented once during the design of the current sensor 20.

The computation matrix M comprises a set of terms T.

The terms T are arranged in a set of rows L and columns C of the computation matrix M.

The computation matrix M comprises the number of values Nv of rows L. The computation matrix comprises a second number N2 of columns C. Each row L thus comprises the second number N2 of terms T.

Each term T of the computation matrix M is an elementary function of a decomposition into spatial harmonics of the magnetic field Cm.

The term "decomposition into spatial harmonics" is understood herein to mean that a value of each component of the magnetic field Cm is capable of being computed, at any point in space, as an infinite sum of products. Each product is expressed between a coefficient and the corresponding elementary function.

Each coefficient is a number.

Each elementary function is a function defined for any point in space and dependent on the position of the point considered in space.

According to the principle of decomposition into spatial harmonics, the elementary functions are identical, regardless of the magnetic field Cm considered, however each magnetic field Cm is entirely defined by the corresponding values of the coefficients. In other words, the elementary functions form a base in which the magnetic field Cm is capable of being described.

In particular, each elementary function is a function of the position of the point considered relative to a reference point Pr. For example, each elementary function is a function of a power of the distance $r_i$ between the point considered and the reference point. In the paragraphs of this description below, the term "order" is understood to mean "power" as defined in the previous sentence.

Thus, each term T is a function of the position of a corresponding measuring point $Pm_i$ relative to the reference point Pr. For example, each term T of the same row L is a function of the position of the same measuring point $Pm_i$ corresponding to a magnetic field sensor 27.

In particular, each term T is proportional to a distance $r_i$ between the corresponding measuring point $Pm_i$ and the reference point Pr, raised to a power of greater than or equal to zero.

A maximum order N is defined as the maximum order of the terms of the decomposition of the magnetic field into spatial harmonics. In other words, the infinite sum of terms is truncated to give a sufficient approximation of the magnetic field with a finite number of terms, dependent on the maximum order N. The order N is, for example, equal to 4.

For example, each row L of the computation matrix M comprises the same number of terms T as the number of defined elementary functions associated with the orders between 0 and the maximum order N.

Each term T of the same column C is proportional to a distance $r_i$ raised to a power that is identical for all of the terms T of the column C.

During the formation step 120, each magnetic field sensor 27 measures a value Gm of a magnetic field component at the corresponding measuring point $Pm_i$.

The computer 30 receives the measured values Gm from the magnetic field sensors 27. A measurement vector B is then formed.

For example, the measurement vector B comprises the number of values Nv of components $b_I$, where I is an index. Each component $b_I$ is a value Gm of a magnetic field component measured. Each component $b_I$ is associated with a row of the computation matrix M and is identified by the corresponding index I.

The components $b_I$ are ordered in the vector B in order of increasing indices I. Each component $b_I$ is measured at the measuring point $Pm_i$ associated with the corresponding row L.

During the computation step 130, a vector of coefficients A is computed by the processor 40.

The vector of coefficients A comprises the second number N2 of components α.

The real values of the components α of the vector A of coefficients are such that the matrix relation:

$$B = M \times A \quad \text{(Equation 1)}$$

wherein "×" denotes the matrix multiplication operation, is satisfied.

In other words, the components of the vector of coefficients A are computed by solving the inverse problem of equation 1 above.

Thus, since the current sensor 20 is separate from the first conductor 15A, equation 1 corresponds to the solution of an internal problem with decomposition into spatial harmonics at increasing power of the distance $r_i$ relative to the reference point Pr.

Equation 1 describes a decomposition into spatial harmonics of the magnetic field values measured, wherein only a number of products equal to the result of the multiplication of the number of values Nv and of the second number N2 are computed.

Each component α is thus a coefficient of the decomposition of the magnetic field Cm into spatial harmonics.

Each component α computed by the above equation 1 is also referred to as a real value of the component α.

Each component α of the vector of coefficients A is solely proportional to the current IA passing through the first conductor 15A when no other magnetic field source is present, for example when no other current IB is passing through the second conductor 15B and when the magnetic environment is negligible. Each conversion coefficient K is computed during the calibration step 100 from a mathematical function connecting a value of a component α and the current IA passing through the first conductor 15A.

During the determination step 140, the intensity IA of the current passing through the first conductor 15A is determined from the computed components α of the vector of coefficients A.

The determination of the intensity IA comprises dividing a real value of a coefficient α by a corresponding conversion coefficient K.

The intensity IA is, for example, equal to the result of dividing a real value of a coefficient α associated with the highest power value, i.e. the maximum order N, by the corresponding conversion coefficient K. Thus, when the conversion coefficients K are known and the components α are determined by way of the previous equation 1, the current IA passing through the first conductor 15A is computed with precision.

The measuring method implemented by the current sensor 20 advantageously uses the fact that the sources distant from the array 25 contribute to a lesser extent to the coefficients than the sources close to the array 25, all the more so as the order associated with the coefficient α increases. In particular, the measuring method is less sensitive to the current IB passing through the second conductor 15B, when the second conductor 15B is further away from the array 25. This sensitivity is even lower, the more the coefficients α are associated with a high order. Thus, the precision of the method is improved compared to that of the measuring methods of the prior art, by mathematically setting aside field sources other than the current IA that is to be measured, while avoiding any need to implement a shielding system.

Moreover, the measuring method is capable of being implemented by a current sensor 20 disposed in the vicinity of the conductor 15A, the intensity of whose current is to be measured, but not surrounding this conductor 15A. The placement of the current sensor 20 is thus facilitated. In particular, the placement of the current sensor 30 does not require the current circulating in the conductor 15A in question to be cut.

The first example has been described in the case whereby the intensity IA is determined by dividing a real value of a coefficient α associated with the highest value of the power, i.e. the maximum order N, by the corresponding conversion coefficient K. It should be noted that the intensity IA is capable of being obtained from orders that differ from the maximum order N. This is in particular the case if a plurality of different arrays 25 having different reference points Pr are integrated into the same current sensor 20.

A second example of an array 25 of magnetic field sensors 27 is diagrammatically shown, in the operate position thereof, in FIG. 3.

Each conductor 15A, 15B extends in a main direction Z.

Each conductor 15A, 15B has a shape having sections perpendicular to the main direction Z. For example, each conductor 15A, 15B is cylindrical with a circular base. In such a case, the intersection of a conductor 15A, 15B with a plane perpendicular to the main direction Z is a disc. The joining of the centres of each disc of the same conductor 15A, 15B thus forms a segment parallel to the main direction Z, referred to as a central line Lc of the conductor 15A, 15B considered.

A length, in the main direction Z, is defined for each conductor. The length is, for example, 1 metre (m) either side of the array 25. Such dimensions allow the magnetic field to be considered to be invariant in the main direction Z.

A direction X and a direction Y are shown in FIG. 3. The directions X and Y are perpendicular to one another as well as to the main direction Z, and form with the main direction Z a Cartesian coordinate system centred on the reference point Pr.

The position of the central line Lc of the first conductor 15A is denoted in a polar coordinate system, having the reference point Pr at its centre, associated with the coordinate system (XYZ) by the polar coordinates (d0, φ0) thereof. In this case, d0 is the distance, measured in a plane perpendicular to the main direction Z, between the reference point and a point belonging to the central line Lc of the first conductor 15A, and φ0 is the angle between the direction X and a segment connecting the reference point Pr to the point belonging to the aforementioned central line Lc.

The position in space of the central line Lc of the first conductor 15A relative to the reference point Pr is, for example, an assumed position wherein the arm is provided to fix the reference point Pr. In other words, the values of the angle φ0 and of the distance d0 are fixed by the construction of the sensor array 25 and the support thereof, and by the choice of the directions Y and Z used for the measuring method.

The angle φ0 is, for example, equal to 180 degrees (°).

The distance d0 is, for example, equal to 10 centimetres (cm).

The position of each measuring point $Pm_i$ is defined, relative to the reference point Pr, by a set of an angle $\vartheta_i$ and a distance $r_i$ measured in a plane perpendicular to the main direction Z between the measuring point $Pm_i$ and the reference point Pr. The angle $\vartheta_i$ is, for example, the angle between the direction X and a segment connecting the measuring point $Pm_i$ and the reference point Pr.

For clarity purposes, FIG. 3 only shows six magnetic field sensors 27.

According to the example in FIG. 3, the measuring points $Pm_i$ are arranged along a circle. For example, the circle lies in a plane perpendicular to the main direction Z.

For example, the measuring points $Pm_i$ are distributed at equal angles along the circle, i.e. an angle between a measuring point $Pm_i$, the centre of the circle and one of the two neighbouring measuring points $Pm_i$ is identical to the angle between the measuring point $Pm_i$ considered, the centre of the circle and the other neighbouring measuring point $Pm_i$.

The circle has, for example, a radius that lies in the range 2 cm to 5 cm. It should be noted that different radius values can be considered as a function of the arrangement of the conductors 15A, 15B and the currents IA, IB considered. The reference point Pr is, for example, the centre of the circle on which the measuring points $Pm_i$ are arranged.

According to the example in FIG. 3, each measurement direction Dm is defined in a coordinate system dependent on the corresponding measuring point $Pm_i$.

For example, each measurement direction Dm is an orthoradial direction or a radial direction. An orthoradial direction is a direction perpendicular to a segment connecting the centre of the circle to the measuring point $Pm_i$ considered and lies in the plane of the circle. A radial direction is a direction defined by a straight line connecting the centre of the circle to the measuring point $Pm_i$.

In FIG. 3, a radial direction Dmr and an orthoradial direction Dmϑ are shown for each measuring point $Pm_i$.

According to the example in FIG. 3, each magnetic field sensor 27 configured to measure a magnetic field component in an orthoradial direction Dmϑ is associated with a measuring point $Pm_i$ that is different from the other measuring points $Pm_i$ associated with magnetic field components in orthoradial directions.

For example, each magnetic field sensor 27 is configured to measure a value Gm of a component in an orthoradial direction Dmϑ and a value Gmr of a component in a radial direction Dmr of a magnetic field at a single measuring point $Pm_i$.

Thus, each magnetic field sensor 27 is configured to measure two values Gm of components, in two different directions, at a single measuring point $Pm_i$.

In a polar coordinate system, each conversion coefficient is either a function of a sine of the angle φ0 or a function of a cosine of the angle φ0. In the paragraphs below, each conversion coefficient dependent on a cosine will be identified by a reference $Ka_n$ and each conversion coefficient dependent on a sine will be identified by a reference $Kb_n$.

It should be noted that functions of a cosine of a number are capable of being expressed in the form of a sine of a difference between π/2 and this number. Similarly, a function of a sine is capable of being expressed in the form of a cosine of a difference between π/2 and this number. The term "function of a cosine" is understood to mean a function dependent on a cosine of the number considered and not a difference between π/2 and this number. The term "function of a sine" is understood to mean a function dependent on a sine of the number considered and not a difference between π/2 and this number.

Each conversion coefficient $Ka_n$, $Kb_n$ is identified by an index n variant of 1 to the order N.

Similarly, each component α is either a function of a sine of the angle φ0 or a function of a cosine of the angle φ0. In the paragraphs below, each component α dependent on a cosine will be identified by a reference $a_n$ and each component α dependent on a sine will be identified by a reference $b_n$.

Each component $a_n$, $b_n$ is identified by an index n variant of 1 to the order N.

Each conversion coefficient $Ka_n$, $Kb_n$ satisfies, in an ideal theoretical case, one of the equations 2 or 3 hereinbelow:

$$U_n \cdot \frac{\cos(n\varphi 0)}{n(d0)^n} = Ka_n \quad \text{(Equation 2)}$$

$$U_n \cdot \frac{\sin(n\varphi 0)}{n(d0)^n} = Kb_n \quad \text{(Equation 3)}$$

wherein $U_n$ is a real arbitrary constant linked to the practical conditions of implementing the current sensor 20.

According to the principle of decomposition into spatial harmonics, the values of the radial component Gmr and orthoradial component Gmϑ of the magnetic field Cm at a measuring point $Pm_i$ are thus capable of being written according to the equations 4 and 5 hereinbelow:

$$Gmr(r_i, \vartheta_i) = \sum_{n=1}^{\infty} n \cdot r_i^{n-1} [-a_n \sin(n\vartheta_i) + b_n \cos(n\vartheta_i)] \quad \text{(Equation 4)}$$

$$Gm\vartheta(r_i, \vartheta_i) = \sum_{n=1}^{\infty} n \cdot r_i^{n-1} [a_n \cos(n\vartheta_i) + b_n \sin(n\vartheta_i)] \quad \text{(Equation 5)}$$

wherein $a_n$ and $b_n$ are coefficients of the decomposition into spatial harmonics, Σ is the symbol of a summation, $\vartheta_i$ and $r_i$ are the polar coordinates of the measuring point $Pm_i$ and the reference point Pr, cos denotes the cosine function and sin denotes the sine function.

Each term T is a function of a cosine of the angle Di and/or of a sine of the angle $\vartheta_i$.

For example, the matrix M satisfies the equation:

$$M = \begin{pmatrix} \cos(\vartheta_1) & \sin(\vartheta_1) & \ldots & Nr_i^{N-1}\cos(N\vartheta_1) & Nri^N \sin(N\vartheta_1) \\ -\sin(\vartheta_1) & \cos(\vartheta_1) & \ldots & -Nr_i^{N-1}\sin(N\vartheta_1) & -Nri^{N-1}\cos(N\vartheta_1) \\ \ldots & \ldots & \ldots & \ldots & \ldots \\ \ldots & \ldots & \ldots & \ldots & \ldots \\ \cos(\vartheta_{N1}) & \sin(\vartheta_{N1}) & \ldots & Nr_i^{N-1}\cos(N\vartheta_{N1}) & Nr_i^{N-1}\sin(N\vartheta_{N1}) \\ -\sin(\vartheta_{N1}) & \cos(\vartheta_{N1}) & \ldots & -Nr_i^{N-1}\sin(N\vartheta_{N1}) & -Nr_i^{N-1}\cos(N\vartheta_{N1}) \end{pmatrix} \quad \text{(Equation 6)}$$

When the matrix M satisfies the equation 6, the vector B is, for example, equal to:

$$B = \begin{pmatrix} Gm\vartheta_1 \\ Gmr1 \\ \ldots \\ Gm\vartheta_{N-1} \\ Gmr_{N-1} \end{pmatrix} \quad \text{(Equation 7)}$$

In such a case, the equation 1 hereinabove corresponds to a truncation to the maximum order N of the decomposition into spatial harmonics of the magnetic field measured. It is thus possible to show that the coefficients $a_n$ and $b_n$ of the above equations 4 and 5 satisfy the equations 8 and 9 hereinbelow when the current IA passing through the first conductor 15A is the only field source present:

$$a_n = U_n \cdot \frac{\cos(n\varphi 0)}{n(d0)^n} IA = Ka_n \cdot IA \quad \text{(Equation 8)}$$

$$b_n = U_n \cdot \frac{\sin(n\varphi 0)}{n(d0)^n} IA = Kb_n \cdot IA. \quad \text{(Equation 9)}$$

The equations 8 and 9 hereinabove allow assumed values of the coefficients $a_n$ and $b_n$ to be computed, in an ideal theoretical case where the constant $U_n$ is arbitrarily unitary, the cylindrical coordinates d0, φ0 relative to the reference point Pr and the position in space of the measuring points $Pm_i$ are perfectly well known. Each coefficient $a_n$ or $b_n$ is thus observed to be effectively proportional to the current IA to be determined. The proportion factor is the corresponding conversion coefficient $Ka_n$, $Kb_n$.

For simplicity purposes, the previous examples have been described in a case wherein a single current sensor 20 is used to measure the intensity IA of a current passing through a single conductor 15A.

In the case wherein a second conductor 15B through which passes the current IB is present, it also contributes to the magnetic field at each measuring point $Pm_i$ in a similar manner to the current IA passing through the first conductor 15A. Thus, the contribution of the current IB passing through the second conductor 15B satisfies the equations 4 and 5 hereinabove, whereby the contributions to the coefficients $a_n$ and $b_n$ are computed according to the equations 8 and 9 by replacing the polar coordinates (d0, φ0) of the centre of the first conductor 15A by the polar coordinates (db, φb) of the centre of the second conductor 15B. This contribution is added in a linear manner to that of the first conductor 15A.

It is clear that as the distance db between the reference point Pr and the centre of the second conductor 15B is strictly greater than the distance d0 between the reference point Pr and the centre of the first conductor 15A, the contribution from the current IB passing through the second conductor 15B in the computation of the coefficients $a_n$ and $b_n$ is lower than for the current IA passing through the first conductor 15A. This difference increases as the order n considered increases.

Thus, for a relatively large index n, the contribution of the current IB is low enough to consider with high precision that the coefficients $a_n$ and $b_n$ are solely proportional to the current IA passing through the first conductor 15A, even though the current IB passing through the second conductor is not null. This is also true for all other external sources located further away from the reference point Pr than the conductors 15A, 15B.

Thus, by selecting the highest orders, the contributions of the sources are spatially filtered so as to only retain the contributions from the closest source, i.e. in this case from the current IA of the first conductor 15A.

It should be noted that, due to practical implementation restrictions, for example if the maximum order N is too low to fully describe the magnetic field or if the number of measurements Nv carried out is insufficient, the constant $U_n$ present in the equations 8 and 9 can deviate from the unit value. However, the coefficients α remain linearly dependent on the intensity IA, for example if only the conductor 15A is analysed. Thus, the value of the intensity IA can still be obtained with high precision.

A calibration procedure for obtaining a precise value of the conversion coefficients K is described hereafter.

According to an alternative embodiment, the current sensor 20 forms part of a measuring system including a plurality of current sensors 20 and a single central controller.

The computer 30 of each current sensor 20 is configured to communicate with the central controller. For example, each current sensor 20 is connected to the central controller by a wired connection.

Alternatively, each current sensor 20 is configured to communicate with the central controller by radio frequency communication.

This means that the computer 30 is suitable for emitting or receiving data transmitted via a signal having at least one radiofrequency electromagnetic wave. The radiofrequency electromagnetic waves are electromagnetic waves having a frequency of between 3 kilohertz (KHz) and 3 gigahertz (GHz).

The computer 30 of each current sensor 20 is configured to transmit the values of the intensities IA, IB measured to the central controller. The central controller is configured to store the values of the intensities IA, IB measured in memory. The central controller is further configured to display or transmit the values of the intensities IA, IB measured to a user.

According to another alternative embodiment, the values Gmr, Gm measured at each measuring point $Pm_i$ are transmitted to the central controller, which implements the obtainment step 110, formation step 120, computation step 130 and determination step 140 for each current sensor 20.

According to one specific embodiment, the current sensor 20 is obtained by a design method using the measuring method hereinabove.

In particular, the number of values Nv, and thus the number of magnetic field sensors 27, are determined by the design method as a function of a desired measurement precision.

The spatial positioning of the magnetic field sensors 27 is also determined using the measuring method. In particular, the spatial positioning of the magnetic field sensors 27 is chosen so as to simplify the computations carried out during the formation step 120, computation step 130 and determination step 140.

For example, the orientation of each magnetic field sensor 27 is chosen such that the measured magnetic field values Gmr, Gmϑ are easily transposable in a chosen coordinate system.

According to one embodiment, the maximum order is less than or equal to 5 for a distance d0 of less than or equal to 10 cm. In practice, a maximum order N equal to 4, and a distance d0 equal to 6 centimetres between the centre of the circle on which the measuring points $Pm_i$ are disposed and the centre of the first conductor 15A allow a precision that is generally less than 0.5% to be obtained when the radius $r_i$ of the circle is equal to 3.2 cm, even in the event of significant interference.

The second example hereinabove was provided in the case wherein the magnetic field is described in a simple manner in a polar coordinate system. This is in particular the case of rectilinear conductors 15A, 15B for which the magnetic field Cm generated by the conductors 15A, 15B can be considered to not vary as a function of the position in the main direction Z. Thus, all of the measured components of the magnetic field Cm are included in the same plane, which is the plane of the circle on which the measuring points $Pm_i$ are arranged. The magnetic field sensor array 25 is thus easy to produce.

Moreover, the computations carried out when implementing the measuring method are relatively simple. The measuring method thus consumes few computing resources.

However, it should be noted that other coordinate systems are capable of being used for different conductor geometrical configurations, using a functions base adapted to the coordinate systems used for the equations 1 to 9 hereinabove.

For example, a third example of a current sensor 20 is shown in FIG. 4. The elements identical to those of the second example in FIG. 3 are not described again. Only the differences therewith are highlighted.

The measuring points $Pm_i$ are arranged on a sphere, the centre whereof is the reference point Pr. For example, the measuring points $Pm_i$ are distributed over a set of parallels P of the sphere.

According to one embodiment, the array 25 includes 30 magnetic field sensors 27 distributed over 5 parallels P. For example, six measuring points $Pm_i$ are arranged on each parallel P. The measuring points $Pm_i$ arranged along the same parallel P are, for example, distributed evenly along the parallel P.

Each parallel P is a circle within the sphere, the centres of the parallels P being aligned along a straight line D passing through the centre of the sphere. Each parallel P is defined by the intersection of a plane and of the sphere, the planes being parallel to one another and offset relative to one another in the direction of the straight line D. The straight line D is, for example, parallel to the main direction Z.

Each magnetic field sensor 27 is configured to measure values Gm of magnetic field components at the same measuring point $Pm_i$ in three different measurement directions Dm.

Each of the measurement directions Dm is parallel to a basis vector of a system of spherical coordinates associated with the point $Pm_i$ considered. In the spherical coordinate system, the spatial coordinates of each measuring point $Pm_i$ are the radius $r_i$ and two angles $\varphi_i$ and $\theta_i$. The radius $r_i$ is the distance between the measuring point $Pm_i$ and the reference point Pr. The angle $\theta_i$ is an angle between the main direction Z and a segment connecting the measuring point $Pm_i$ to the reference point Pr. The angle $\varphi_i$ is an angle between the direction X and the projection of the same segment on a plane perpendicular to the main direction Z.

For simplicity purposes, FIG. 4 shows a single measuring point Pm with the measurement directions Dm and associated coordinates. The indices i of the associated references are thus not shown.

The three measurement directions Dm are, for example, two tangential directions $D\varphi$, $D\theta$ and one radial direction Dr.

Each tangential direction $D\varphi$, $D\theta$ is a direction tangent to the sphere at the corresponding measuring point $Pm_i$. The tangential direction $D\varphi$ is perpendicular to a plane containing the main direction Z and a segment connecting the corresponding measuring point $Pm_i$ to the reference point Pr. Each radial direction Dr is a direction parallel to the segment connecting the corresponding measuring point $Pm_i$ to the reference point Pr. The tangential direction $D\theta$ is perpendicular to the tangential direction $D\varphi$ and to the radial direction Dr.

The third example of a current sensor 20 is thus adapted to cases wherein the conductors 15A, 15B are not rectilinear and wherein the magnetic field Cm thus has significant components in the three measurement directions Dm.

Since the magnetic field Cm is three-dimensional, the elementary functions for the computation of M are more complex, however this third example can be adapted to a larger number of configurations of the conductors 15A, 15B.

The magnetic field Cm thus satisfies the equation:

$$Cm(r_i, \theta_i, \varphi_i) = -\sum_{n=1}^{N} \sum_{m=-n}^{n} \alpha_{n,m} \nabla_{r_i, \theta_i, \varphi_i} [r_i^n Y_n^m(\theta_i, \varphi_i)] \quad \text{(Equation 10)}$$

wherein:
$\nabla$ is the differential operator Nabla,
$\alpha_{n,m}$ is a coefficient of the decomposition into spatial harmonics in the system of spherical coordinates and
$Y_n^m$ are spherical harmonics functions.

It should be noted that, for a given maximum order N, a larger number N2 of terms T are computed compared to the second example hereinabove and a larger number of values Gm of the magnetic field are measured.

According to a fourth example, each current is a variable current. For example, each current is a phase of a three-phase current.

The formation step 120, computation step 130 and determination step 140 are thus iterated in this order with a predetermined iteration period. The iteration period corresponds to a sampling frequency of the values Gm of the magnetic field.

Preferably, the formation step 120, computation step 130 and determination step 140 are iterated over a time period corresponding to a plurality of periods of the current.

A Fourier transform is then applied to the intensity IA values measured to obtain an effective value of the intensity IA. The Fourier transform is, for example, obtained with a Fast Fourier Transform (FFT) algorithm.

The Fourier transform is, for example, a temporal Fourier transform, i.e. as a function of time.

Alternatively, during each formation step 120, a Fourier transform is applied to a set of measurement vectors B obtained during the formation step 120 and a plurality of previous formation steps 120 to compute a Fourier transform TB of the measurement vector B.

The computation step 130 is then implemented with the Fourier transform TB instead of the measurement vector B to obtain a Fourier transform of the vector of coefficients A.

According to a fifth example, the calibration step 100 comprises an optimisation step 150 and a step 160 of computing a conversion coefficient $Ka_n$, $Kb_n$.

It should be noted that in the equations 1 to 10 hereinabove, a certain number of parameters of the current sensor 20 are used, such as spatial coordinates. These parameters are capable of varying as a function of the manufacture of the current sensor 20 or during the life thereof, for example after impacts or in the event of incorrect positioning of the array 25 relative to the first conductor 15A, or in the event of ageing of the materials.

During the optimisation step 150, parameters of the current sensor 20 are optimised to improve the precision of subsequent computations. The optimised parameters are, in particular, geometric parameters of the current sensor 20. In particular, a real position of the centre of the first conductor 15A relative to the reference point Pr is obtained.

During the optimisation step 150, the step 110 of obtaining a matrix, the formation step 120 and the computation step 130 are implemented for any value whatsoever of the intensity IA. This is shown in FIG. 5 by steps 110c, 120c and 130c.

According to one method of implementing the invention, the optimisation step 150 is implemented for a value of the intensity IA that is sufficiently high to overcome any potential magnetic noise.

For example, the real position of the centre of the first conductor 15A relative to the reference point Pr is obtained by minimisation of a deviation for a plurality of routine positions Pc.

More specifically, a set of coefficients $\alpha$ is computed for a set of positions of the centre of the first conductor 15A relative to the reference point Pr, referred to as routine positions Pc. Each routine position Pc is a position wherein the centre of the first conductor 15A is capable of being located relative to the reference point Pr subsequent to improper placement or an imprecision in the construction of the current sensor 20 or even subsequent to a modification of the geometrical configuration of the current sensor 20 after the manufacture thereof, for example as a result of an impact or wear.

Each routine position Pc is, for example, chosen from a range of predetermined positions.

In the case wherein the assumed position of the centre of the first conductor 15A relative to the reference point Pr is defined, in a system of cylindrical coordinates, by a distance d0 and by an angle $\varphi 0$, each routine position Pc is, for example, a pair of a routine angle $\varphi c$ and a routine distance dc.

A set of so-called intermediate coefficients $\alpha_i$ is thus computed, during the optimisation step 150, for each set of parameters.

During the obtainment step 110c, the matrix M is computed for each routine position Pc.

During the formation step 120c, the vector B is computed according to the Biot-Savart law and is no longer measured as a function of the intensity IA of the current.

During step 130c, the intermediate coefficients $\alpha_i$ are computed according to the equation 1, using the matrix M and the vector B computed during steps 110c and 120c.

For example, a pair of intermediate coefficients $\alpha_i$ is computed for each routine position Pc.

The number of routine positions Pc used is determined as a function of the configuration of the at least one conductors 15A, 15B, of the mode of fixing the array 25 to the first conductor 15A and of the desired precision for the measurement of the intensity IA.

For example, the routine positions Pc correspond to distances d0 between the reference point Pr and the centre of the first conductor 15A lying in the range 5 cm to 50 cm. According to one specific method of implementing the invention, the set of distances d0 corresponding to the routine positions Pc covers the range between 5 cm and 15 cm with a pitch of 1 millimetre (mm).

The set of angles $\varphi 0$ between the direction X and a segment connecting the reference point Pr to the centre of the first conductor 15A covers, for example, the range between 175° and 185°, with a pitch of 0.5°.

According to one embodiment, a set of intermediate ratios $R_\alpha$ between the intermediate coefficients $\alpha_i$ is computed.

Each intermediate ratio $R_\alpha$ is computed by dividing a numerator by a denominator, the numerator being an intermediate coefficient $\alpha_i$ computed by assuming a routine position Pc and for a given value of the index n and the denominator being another intermediate coefficient $\alpha_i$ computed for the same routine position Pc. For example, the denominator and the numerator correspond to different values of the index n. Alternatively, the denominator and the numerator can also correspond to identical values of the index n.

For example, each intermediate ratio $R_\alpha$ is obtained by dividing intermediate coefficients $\alpha_i$ computed for values of the index n having a difference that is equal to 1.

When two intermediate coefficients $\alpha_i$, denoted $a_{c_n}$ hereafter, satisfy the previous equation 8, the corresponding intermediate ratio $R_\alpha$ identified by a reference $Rca_n$, in the absence of any magnetic field source other than the first conductor 15A, thus satisfies the equation:

$$Rca_n = \frac{ac_{n+1}}{ac_n} = \frac{U_{n+1}}{U_n} \frac{1}{dc} \frac{n}{(n+1)} \frac{\cos((n+1) \cdot \varphi c)}{\cos(n \cdot \varphi c)} \quad \text{(Equation 11)}$$

It should be noted that, even in the presence of other magnetic field sources in addition to the conductor 15A for example, the equation 11 remains valid from an order N that is large enough to allow the influence of these other sources to be disregarded, as a function of the desired precision level.

According to another alternative embodiment, at least one intermediate ratio $R_\alpha$, identified by a reference $Rcc_n$, is computed from an intermediate coefficient, denoted $a_{c_n}$, satisfying the previous equation 8 and an intermediate coefficient, denoted $b_{c_n}$, satisfying the previous equation 9.

According to one embodiment, for each routine position Pc, a routine ratio $R_\alpha$ is computed for each value of the index n ranging from 1 to N.

Moreover, for each value of the index n ranging from 1 to N, a real ratio $Rra_n$ between two components of the vector of coefficients A is computed according to the equation:

$$Rra_n = \frac{a_{n+1}}{a_n} \quad \text{(Equation 12)}$$

Similarly, for each value of the index n ranging from 1 to N, a real ratio $Rrc_n$ between two components of the vector of coefficients A is computed according to the equation:

$$Rrc_n = \frac{b_{n+1}}{a_n} \quad \text{(Equation 13)}$$

The real position is thus obtained by optimising the routine position Pc by minimising the deviation between a real ratio Rr and a corresponding routine ratio Rc.

For example, absolute values of a set of deviations between real ratios $Rra_n$, $Rrc_n$ and intermediate ratios $Rca_n$, $Rcc_n$ are minimised.

According to one embodiment, the minimisation involves the sum of a set of absolute deviation values between real ratios Rr and the corresponding intermediate ratios Rc.

According to one embodiment, the minimisation is defined by the mathematical expression:

$$\min_{Pc} \sum_{n=1}^{N-1} \left\| \frac{a_{n+1}}{a_n} - Rca_n \right\| + \left\| \frac{b_{n+1}}{a_n} - Rcc_n \right\| \quad \text{(Equation 14)}$$

Thus, the real position is the routine position Pc for which the mathematical expression of the equation 14 is the smallest.

The optimisation step 150 hereinabove is described for the case of optimising the position of the centre of the first conductor 15A relative to the reference point Pr. It should be noted that other parameters of the current sensor 20 are capable of being optimised in this way. For example, spatial coordinates $\vartheta_i$ and $r_i$ of a measuring point $Pm_i$ are capable of being optimised in this way. The routine positions Pc are thus positions that the measuring point $Pm_i$ considered is capable of occupying.

Generally, the set of optimised parameters is the set of parameters that satisfies the mathematical expression of equation 14.

Thus, at the end of the optimisation step 150, a set of optimised parameters is obtained.

During the step 160 of computing a conversion coefficient, a conversion coefficient K is computed by dividing the corresponding coefficient α obtained with the set of parameters, by the intensity IA used during the calibration.

During the determination step 140, the intensity IA is computed from a coefficient α obtained during the computation step 130 and from the corresponding conversion coefficient K computed during the calibration step 100.

The measuring method is thus more precise, since the conversion coefficients K are determined on-site and under real conditions, with precision instead of being assumed to be known. The measuring method is thus less sensitive to potential errors in the placement of the array 25 of magnetic field sensors 27 relative to the first conductor 15A.

Moreover, the calibration step is carried out based on ratios between coefficients $a_n$, $b_n$. Such ratios do not depend on the value of the intensity IA circulating in the first conductor 15A. The calibration is thus capable of being carried out at any time, since it does not require fixing the intensity IA to an assumed predetermined value. In other words, the calibration step 100 does not interfere with the operation of the network 10 either.

The calibration step 110 has been described for the fifth example above in the case wherein the magnetic field Cm is two-dimensional, for example corresponding to the configuration of the second example. It should be noted that this calibration step is capable of being implemented for other configurations by means of an adaptation corresponding to the equations 11 to 13.

According to an alternative embodiment of the calibration step 110, the intensity of the current circulating in the first conductor 15A is known, and the at least one conversion coefficients $Ka_n$, $Kb_n$ are computed according to one of the equations 8 and 9 hereinabove.

The invention corresponds to any combination of the previous embodiments technically possible.

The invention claimed is:

1. A method for measuring an intensity (IA) of a current in an electrical conductor, the method comprising the steps of:
    obtaining a computation matrix M comprising a set of terms (T), each term (T) of a same row of the computation matrix (M) being proportional to a same distance (ri) between a first one of a plurality of measuring points ($Pm_i$) and a reference point (Pr), raised to a power higher than or equal to zero,
    forming a measurement vector B including components ($b_1$), each component ($b_1$) being a measurement of a value of a magnetic field in a first direction of a plurality of directions (Dmr, Dmϑ, Dθ, Dφ, Dr) at a second one of the plurality of measuring points ($Pm_i$), each measuring point ($Pm_i$) associated with a second direction of the plurality of directions (Dmr, Dmϑ, Dθ, Dφ, Dr) being different from the other measuring points ($Pm_i$) associated with the same second direction of the plurality of directions (Dmr, Dmϑ, Dθ, Dφ, Dr),
    computing the components (α) of a vector of coefficients A, each component (α) being a coefficient, each coefficient component (α) being a coefficient of a decomposition of the magnetic field into spatial harmonics and being proportional to the intensity (IA) of the current such that the matrix relation B=M×A is satisfied, where × denotes the matrix multiplication operation, and
    determining the intensity (IA) of the current from at least the computed components (α).

2. The method according to claim 1, wherein the step of obtaining the computation matrix (M) and the computing step are dependent on the parameters of a current sensor, the method further comprising:
    an optimisation step comprising obtaining at least one optimised parameter, such as the actual position of the reference point (Pr) relative to the electrical conductor,
    a step of computing at least one conversion coefficient (K) from the at least one optimised parameters,
    the determination step comprising dividing a real value of the coefficient component (α) by the conversion coefficient (K).

3. The method according to claim 2, wherein the obtainment step is implemented by searching for a set of optimised parameters minimising the deviation between at least two ratios between two components (α) of the vector of coefficients (A) obtained during the step of computing the components (α), and two ratios between two intermediate components ($a_i$), each intermediate component ($a_i$) being a component of a vector of coefficients (A) computed for a set of possible parameters of the current sensor.

4. The method according to claim 1, wherein a first distance (d1) is defined between the reference point (Pr) and a point of the electrical conductor located the closest to the reference point (Pr), the maximum distance of the distances ($r_i$) of the measuring points ($Pm_i$) being strictly less than the first distance (d1).

5. The method according to claim 1, wherein a first distance (d1) is defined between the reference point (Pr) and a point of the electrical conductor located the closest to the reference point (Pr), the maximum distance of the distances of the measuring points ($Pm_i$) being less than or equal to 85% of the first distance (d1).

6. The method according to claim 1, wherein the measuring points ($Pm_i$) are arranged along a circle having the reference point (Pr) at its centre or along a sphere having the reference point (Pr) at its centre.

7. The method according to claim 1, wherein a first distance (d1) is defined between the reference point (Pr) and a point of the electrical conductor located the closest to the reference point (Pr), the first distance (d1) being less than or equal to 10 centimetres and each power being less than or equal to 5.

8. A method for designing a measuring sensor including a plurality of magnetic field sensors, the design method determining, for a desired measurement precision, a number of magnetic field sensors, as well as the spatial positioning of the magnetic field sensors, using the measuring method according to claim 1.

9. A computer adapted to implement the following steps of:
    obtaining a computation matrix (M) comprising a set of terms, each term of a same row of the computation matrix (M) being proportional to a same distance (r) of a first one of a plurality of measuring points ($Pm_i$), raised to a power higher than or equal to zero,
    receiving measurements of a value of a magnetic field in a first direction of a plurality of directions (Dmr, Dmϑ, Dθ, Dφ, Dr) at a second one of the measuring points ($Pm_i$), each measuring point ($Pm_i$) associated with a second direction of the plurality of directions (Dmr, Dmϑ, Dθ, Dφ, Dr) being different from the other measuring points ($Pm_i$) associated with the same second direction of the plurality of directions (Dmr, Dmϑ, Dθ, Dφ, Dr) and at a distance (r) from a reference point (Pr), referred to as the distance of the measuring point, forming a measurement vector B including components ($b_1$), each component being a measurement received, computing the components ($\alpha$) of a vector of coefficients A, each component ($\alpha$) being a coefficient, each coefficient component ($\alpha$) being a coefficient of a decomposition of the magnetic field into spatial harmonics and being proportional to an intensity (IA) of a current passing through an electrical conductor such that the matrix relation B=M×A is satisfied, where × denotes the matrix multiplication operation, and determining the intensity (IA) of the current from at least the components computed.

10. A current sensor configured to measure an intensity (IA) of a current passing through the electrical conductor, the current sensor comprising a plurality of magnetic field sensors and the computer according to claim 9, each magnetic field sensor being configured to measure the value of the magnetic field in the second direction of the plurality of directions (Dmr, Dmϑ, Dθ, Dφ, Dr) at the second one of the plurality of measuring points ($Pm_i$), each measuring point ($Pm_i$) being different and at a distance ($r_i$) from the reference point (Pr), and to transmit the measured value to the computer.

11. A system for measuring currents (IA, IB) passing through a plurality of electrical conductors, the measuring system comprising a plurality of the current sensors according to claim 10 and a single central controller, each current sensor being configured to communicate with the central controller.

\* \* \* \* \*